United States Patent
Reznicek et al.

(10) Patent No.: US 10,679,890 B2
(45) Date of Patent: Jun. 9, 2020

(54) NANOSHEET STRUCTURE WITH ISOLATED GATE

(71) Applicant: International Business Machines Corporation, Armonk, NY (US)

(72) Inventors: Alexander Reznicek, Troy, NY (US); Xin Miao, Guilderland, NY (US); Joshua Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/885,926

(22) Filed: Feb. 1, 2018

(65) Prior Publication Data

US 2019/0237360 A1 Aug. 1, 2019

(51) Int. Cl.
| | |
|---|---|
| H01L 21/762 | (2006.01) |
| H01L 29/78 | (2006.01) |
| H01L 29/06 | (2006.01) |
| H01L 29/66 | (2006.01) |
| H01L 29/423 | (2006.01) |
| H01L 29/786 | (2006.01) |

(52) U.S. Cl.
CPC .... *H01L 21/76297* (2013.01); *H01L 29/0665* (2013.01); *H01L 29/42392* (2013.01); *H01L 29/6653* (2013.01); *H01L 29/6681* (2013.01); *H01L 29/66439* (2013.01); *H01L 29/66545* (2013.01); *H01L 29/66553* (2013.01); *H01L 29/7853* (2013.01); *H01L 29/78696* (2013.01)

(58) Field of Classification Search
CPC ............... H01L 21/76297; H01L 29/0673
See application file for complete search history.

(56) References Cited

U.S. PATENT DOCUMENTS

| | | | |
|---|---|---|---|
| 6,610,548 B1 | 8/2003 | Ami et al. | |
| 6,852,575 B2 | 2/2005 | Bojarczuk, Jr. et al. | |
| 7,135,699 B1 | 11/2006 | Atanackovic | |
| 7,923,743 B2 * | 4/2011 | Bojarczuk, Jr. ........ | B82Y 10/00 257/98 |
| 8,753,942 B2 | 6/2014 | Kuhn et al. | |
| 9,041,106 B2 | 5/2015 | Cappellani et al. | |
| 9,257,527 B2 * | 2/2016 | Hashemi .......... | H01L 29/42392 |
| 9,281,198 B2 | 3/2016 | Adam et al. | |
| 9,881,998 B1 * | 1/2018 | Cheng ................ | H01L 29/0649 |
| 9,991,352 B1 * | 6/2018 | Frougier ................ | B82Y 10/00 |
| 10,224,343 B2 * | 3/2019 | Kim .................... | H01L 27/1203 |
| 2014/0077338 A1 | 3/2014 | Roucka et al. | |
| 2014/0145312 A1 | 5/2014 | Wang et al. | |

(Continued)

OTHER PUBLICATIONS

Anonymous, "Method of Forming a Stacked Silicon Nanowire Device", IPCOM000211772D, Oct. 17, 2011.

*Primary Examiner* — Mark V Prenty
(74) *Attorney, Agent, or Firm* — Patterson + Sheridan, LLP

(57) ABSTRACT

Structures and methods for making nanosheet structures with an electrically isolating feature associated therewith. The structure includes: a substrate, an epitaxial oxide layer over the substrate, a plurality of stacked nanosheets of semiconductor channel material over the epitaxial layer, and a source/drain semiconductor material located laterally adjacent and on each side of the plurality of stacked nanosheets of semiconductor channel material, where the plurality of nanosheets are decoupled from the source/drain semiconductor material by the epitaxial oxide layer.

5 Claims, 7 Drawing Sheets

(56) References Cited

U.S. PATENT DOCUMENTS

| | | |
|---|---|---|
| 2014/0167163 A1 | 6/2014 | Cheng et al. |
| 2014/0312432 A1 | 10/2014 | Ching et al. |
| 2015/0295084 A1 | 10/2015 | Obradovic et al. |
| 2016/0071729 A1 | 3/2016 | Hatcher et al. |

* cited by examiner

NANOSHEET STRUCTURE WITH ISOLATED GATE

BACKGROUND

1. Technical Field

The present application relates to semiconductor technology. More particularly, the present application relates to a semiconductor structure including stacked semiconductor nanosheets and a method of forming the same.

2. Related Art

The use of non-planar semiconductor devices such as, for example, fin field effect transistors (FinFETs) is the next step in the evolution of complementary metal oxide semiconductor (CMOS) devices. Fin field effect transistors (FinFETs) can achieve higher drive currents with increasingly smaller dimensions as compared to conventional planar FETs. As technology progresses, further improvements over conventional FinFETs are required.

SUMMARY

Figure 1:
FIG. 1 illustrates a substrate that can be used in accordance with at least one embodiment of the present disclosure.

One aspect of the present disclosure includes a semiconductor structure. The structure includes: a substrate, an epitaxial oxide layer over the substrate, a plurality of stacked nanosheets of semiconductor channel material over the epitaxial layer, and a source/drain semiconductor material located laterally adjacent and on each side of the plurality of stacked nanosheets of semiconductor channel material, where the plurality of nanosheets are decoupled from the source/drain semiconductor material by the epitaxial oxide layer.

Another aspect of the present disclosure includes a method for making a semiconductor device. The method includes: providing a substrate, epitaxially growing an oxide layer over the substrate, epitaxially growing a stack of a plurality of alternating semiconductor layers over the epitaxial oxide layer, forming a plurality of suspended nanosheets from the epitaxially grown alternating layers, forming a source/drain semiconductor region in contact with lateral portions of the plurality of nanosheets and the epitaxial oxide layer, forming a plurality of functional gate structures, each of the plurality of functional gate structures in contact with at least one of the plurality nanosheets, and decoupling the i) the plurality of functional gate structures and ii) the plurality of suspended nanosheets from the substrate by contacting at least a portion of a bottom one of the plurality of functional gate structures with the epitaxial oxide layer.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Aspects of the present disclosure provide structures, and methods of making the same, of a semiconductor device with an epitaxially grown oxide layer electrically isolating one or more nanosheet structures from an underlying substrate associated with the device. Nanosheet structures are useful semiconductor structures as a general matter, and structures employing nanosheets are being pursued as a viable device option beyond 7 nm nodes. Conventional techniques for nanosheet formation rely on the selective removal of one semiconductor to another in order to form the nanosheet with a gate structure all around; however, in the current art, the gate wrapping of a bottom-most nanosheet channel results substrate contact, which leads to a potential leakage path. One embodiment of the present disclosure remedies this and other problems by electrically isolating one or more bottom nanosheets. This can be accomplished by growing an epitaxial oxide layer over the underlying substrate of the device, and thus a surrounding gate structure associated with the one or more bottom sheets comes into contact with the epitaxial oxide layer, as opposed to the substrate, which would otherwise provide for parasitic conditions, e.g. leakage current through the underlying substrate.

Referring first to FIG. 1, there is illustrated a semiconductor substrate 105 useful with at least one embodiment of the present disclosure, where the substrate 105 can be a single crystalline semiconductor material. In one embodiment, the substrate is a silicon substrate 105, e.g. is pure silicon (Si) or essentially pure silicon. Other suitable substrates including one or more type III-V or type II materials are contemplated although not expressly disclosed herein. The silicon substrate 105 may have any of the well-known crystal orientations. For example, the crystal orientation of the silicon substrate 105 may be {100}, {110}, or {111}. Other crystallographic orientations besides those specifically mentioned can also be used in the present application. Although not expressly shown, the semiconductor substrate 105 can be provided with suitable well structures, e.g. in any order, one or more p-well regions and/or one or more n-well regions, and any suitable implants associated therewith, e.g. boron (B) for a p-well and arsenic (As) for an n-well.

Figure 2:
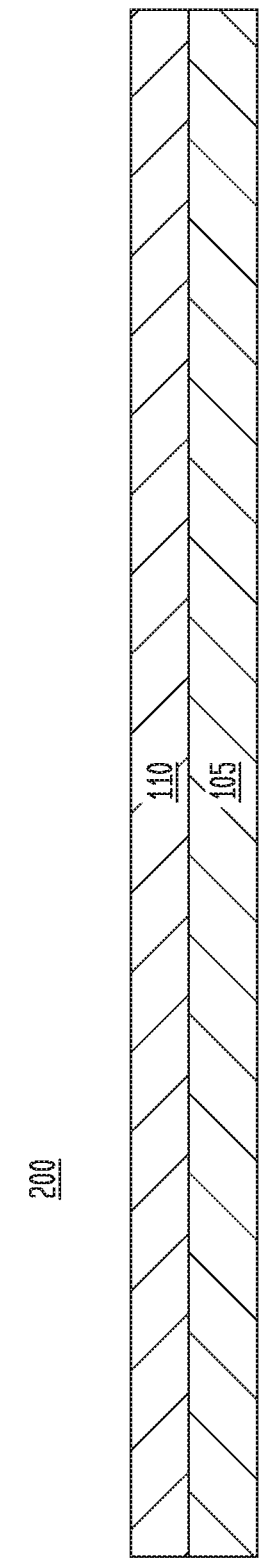
FIG. 2 illustrates growth of an epitaxial oxide layer in accordance with at least one embodiment of the present disclosure.

FIG. 2 depicts forming an epitaxial oxide layer 110 over the silicon substrate 105, and as such forming structure 200. The epitaxial oxide layer 110 may be selected to have a lattice dimension substantially similar to the lattice dimension of the silicon substrate 105. In one embodiment, the epitaxial oxide layer 110 will electrically isolate to-be-developed nanosheet structures, and gate structures associated therewith, from the underlying substrate 105. This in turn improves device functionality by inhibiting leakage current. Moreover, in one embodiment, the epitaxial oxide layer 110 will serve as an etch stop during source/drain development. In one embodiment, the epitaxial oxide layer 110 is a thin epitaxial layer, e.g., between 10 nm and 20 nm in thickness in the vertical direction.

In one example, the epitaxial oxide layer 110 is made from a lanthanum (La), yttrium (Y) and oxygen (O) containing material, which has a lattice dimension that can be closely matched to a silicon lattice. In one embodiment, the epitaxial oxide 110 that is composed of lanthanum, yttrium and oxygen can be a $(La_xY_{1-x})_2O_3$ alloy. The epitaxial oxide layer 110 that contains a lanthanum, yttrium and oxygen alloy, e.g., $(La_xY_{1-x})_2O_3$ alloy, may be epitaxially deposited. In an embodiment where the substrate 105 is silicon (Si), X=0.33 for the lanthanum and yttrium containing material, which allows for a perfect or near perfect lattice match between the silicon substrate 105 and the epitaxial oxide layer 120. In this embodiment, the lattice constant of the lanthanum and yttrium compound will be twice that of pure silicon. In this embodiment, and in other embodiments where the yttrium portion is the majority of the lanthanum and yttrium containing material, the lanthanum and yttrium material can crystalize in the cubic structure in relation to the silicon substrate 105. In other embodiments, including where a substrate 105 includes silicon and another material, the concentration of the lanthanum and yttrium can be adjusted to achieve a suitable lattice match.

Other examples of epitaxial oxides that are suitable for use as the epitaxial oxide layer 110, including but not limited to scenarios where a different material other than silicon is employed for the substrate 105, can be selected from the group consisting of cerium oxide ($CeO_2$), aluminum oxide ($Al_2O_3$), lanthanum oxide ($La_2O_3$), yttrium oxide ($Y_2O_3$), ytterbium oxide ($Yb_2O_3$), gadolinium oxide ($Gd_2O_3$), europium oxide ($Eu_2O_3$), erbium trioxide ($Er_2O_3$), dysprosium oxide ($Dy_2O$), holmium oxide ($Ho_2O_3$), thulium oxide ($Tm_2O_3$), lutetium oxide ($Lu_2O_3$), terbium oxide, ($Tb_2O_3$), hafnium oxide ($HfO_2$) or combinations thereof.

"Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface, e.g., the epitaxial oxide, will take on a {100} orientation.

In some embodiments, as when the epitaxial oxide layer 110 is composed of a lanthanum, yttrium and oxygen containing material, e.g. metastable $(La_xY_{1-x})_2O_3$ alloy, the epitaxial oxide may be formed using molecular beam epitaxial (MBE) deposition. In MBE, material is sublimated (or evaporated in the case of a liquid source) from effusion cells, thus forming molecular beams that are incident upon a heated sample, i.e., deposition surface. In MBE, the molecules of the deposited material land on the surface of the substrate, condense, and build up slowly and systematically, i.e., providing epitaxial growth.

Figure 3:
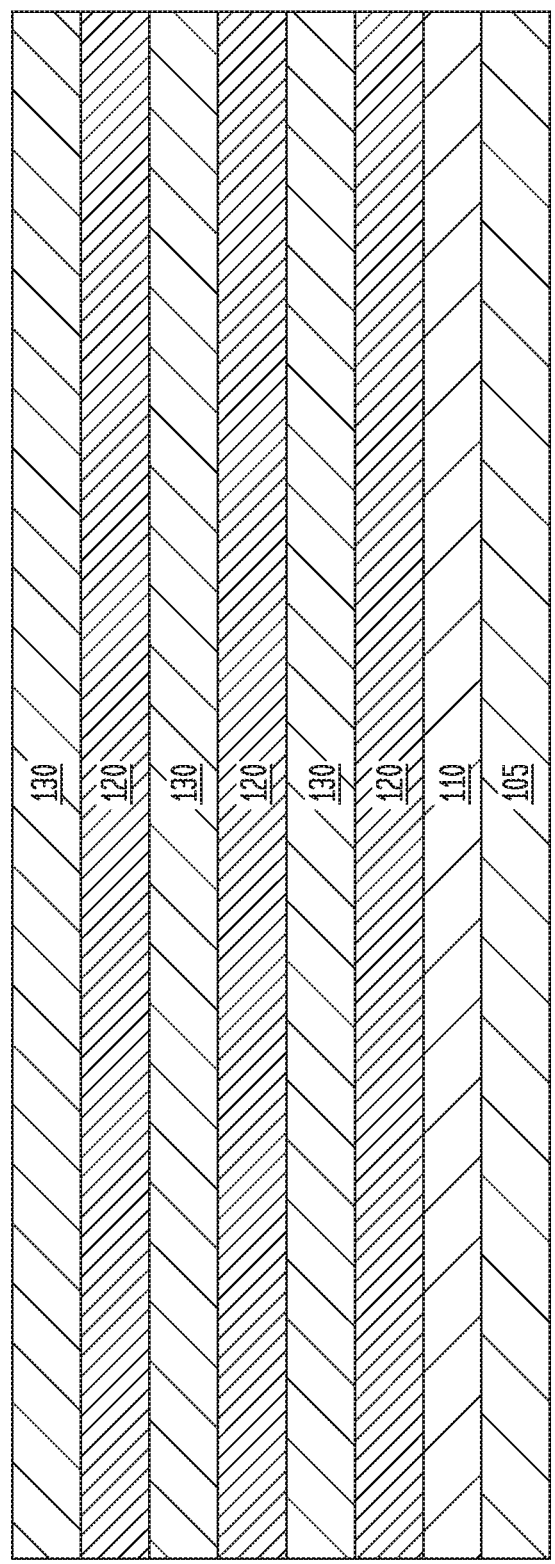
FIG. 3 illustrates growth of a material stack in accordance with at least one embodiment of the present disclosure.

FIG. 3 illustrates a semiconductor structure of FIG. 2 after forming an alternating semiconductor material stack thereon, resulting in structure 300. In one embodiment, the alternating material stack will include one or more semiconductor layers for forming nanosheet channel layers (hereinafter referred to as "nanosheet channel layers" or "nanosheets") 130 and one or more sacrificial layers 120 (hereinafter referred to as "sacrificial layers" or "sacrificial release layers"). Any suitable growth or deposition process, e.g. epitaxial growth, can be used to form the alternating layers 120 and 130. In one embodiment, the one or more sacrificial layers 120 can be suitable silicon-germanium (SiGe) layers that are useful for epitaxially growing a semiconductor layer(s) that can form nanosheet channel layers thereon, e.g. Si. In one embodiment, the sacrificial layers 120 can be suitable Si layers and the nanosheet channel layer(s) 130 can be suitable SiGe layer(s). In one embodiment, the sacrificial layers 120 can be selectively etched relative to the nanosheet channel layer(s) 130. Although examples with respect to Si and SiGe layers are provided, other material can also be used, e.g. type III-V and/or type IV materials can be used to form the stack in accordance with the teachings disclosed herein.

One or more techniques for a suitable fin/nanosheet stack, e.g. "cut stack," can be employed to make at least one structure as discussed herein, including modifying structure 300 in accordance with the teaching discussed herein. Certain relevant techniques are disclosed in U.S. Pat. No. 9,653,289 entitled "Fabrication of Nano-Sheet Transistors with Different Threshold Voltages," ("the patent") the entirety of which is incorporated herein by reference.

Figure 4:
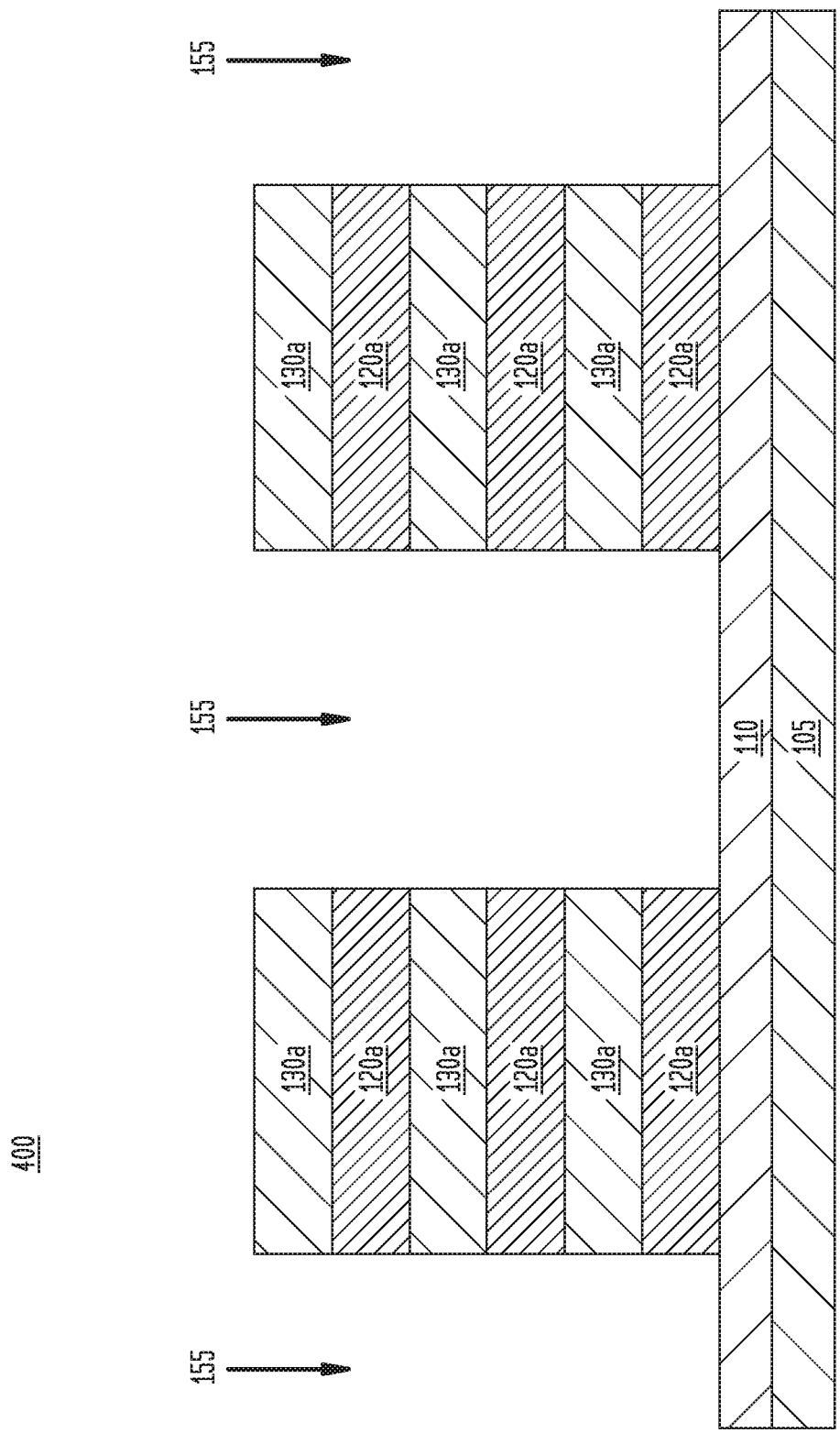
FIG. 4 illustrates a recess process in accordance with at least one embodiment of the present disclosure.

FIG. 4 illustrates an etch process applied to the structure of FIG. 3, resulting in structure 400. In one embodiment, the stack of alternating sacrificial release layers 120 and nanosheet channel layers 130 can be masked and patterned, as is suitable to form a channel stack having a long lateral dimension (i.e., length), a short lateral dimension (i.e., width), and a height. A portion of the stack of sacrificial release layers 120 and nanosheet channel layers 130 can be removed, for example, by a directional etch (e.g., reactive ion etch (ME)) to form a channel stack that includes layer(s) 130A, which will form the basis for final (suspended) nanosheet structures, and layer(s) 120A, e.g. etched sacrificial layers 120. The directional etch may be a non-selective, timed ME to remove unmasked portions of the sacrificial release layers 120 and nanosheet channel layers 130 through a single etching step, or alternating selective RIEs may be used to remove exposed portion(s) of each layer separately. In one embodiment, the epitaxial oxide layer 110 serves as an etch stop layer for a suitable etch process applied to the structure 300. As shown, the structure 400 has a plurality of openings 155 as a result of the etch process, which can be used to form source/drain regions therein.

Figure 5:
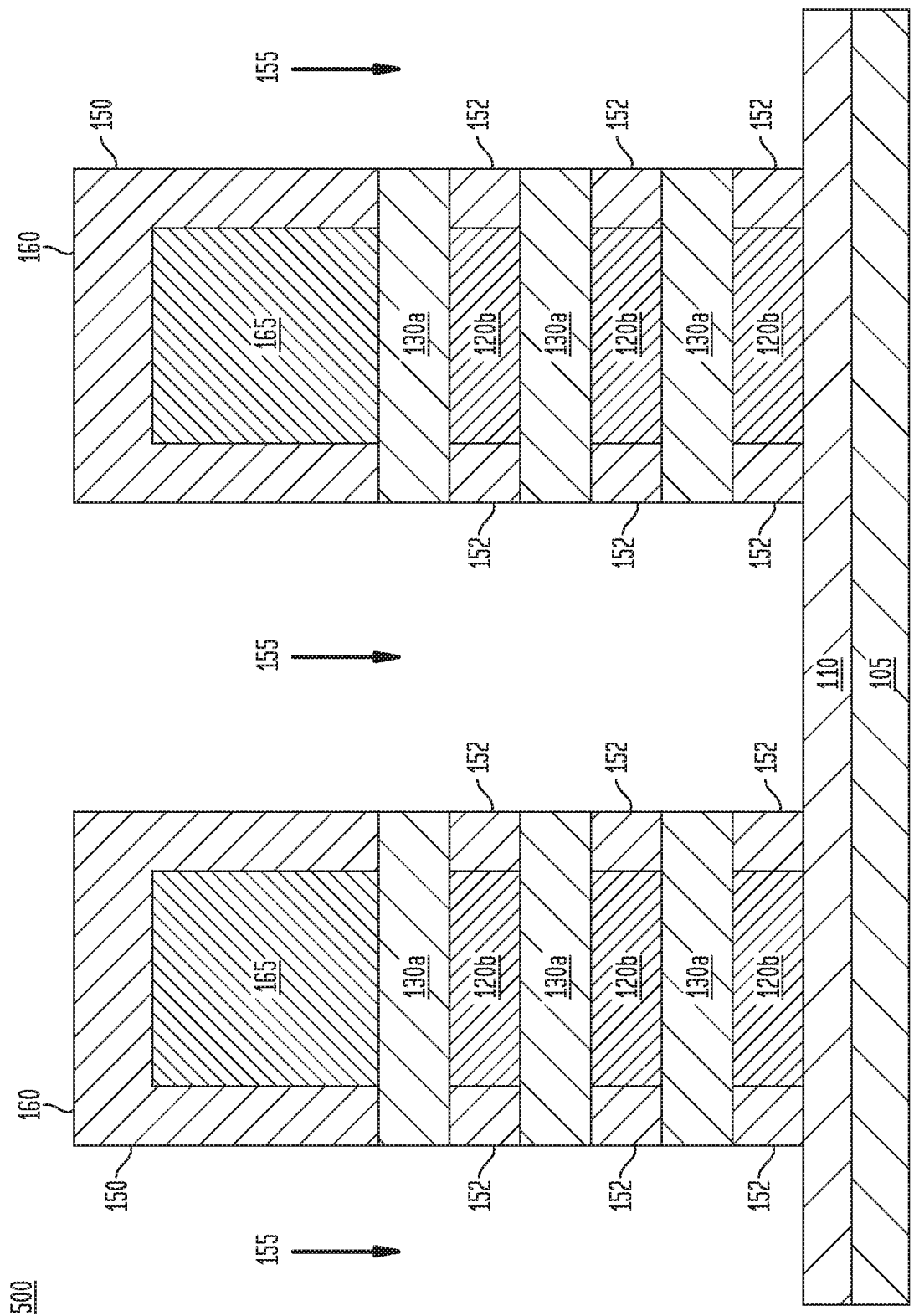
FIG. 5 illustrates formation of one or more sacrificial layers in accordance with at least one embodiment of the present disclosure.

FIG. 5 illustrates forming one or more dummy gates and indentation layers with respect to structure 400, resulting in structure 500. In one embodiment, one or more dummy gates 160 can be formed on the channel stack, e.g. 120A, 130A, resulting in structure 500. In one embodiment, a dummy gate can include side spacers 150 and a dummy gate fill 165. The dummy gate(s) 160 can be formed by suitable processes, including masking, patterning, etching, deposition, and planarization processes/steps. In one embodiment, the dummy gate(s) 160 can be formed by a double patterning process (e.g., sidewall image transfer (SIT)). The side spacer 150 can be completely or partially around the dummy gate fill 165 and can be deposited using suitable conformal deposition techniques and etch techniques, e.g. RIE, to form side spacer(s) 150 in relation to the dummy gate fill 165. In one embodiment, the dummy gate 160 can include a material, e.g. the material of the dummy gate fill 165, that can be easily and selectively removed from the layers of the channel stack 150, including, but not limited to a nitride or oxide, e.g. silicon oxide (SiO), silicon nitride (SiN), silicon oxynitride (SiON), and combinations thereof.

Indentations (not shown) can be formed on lateral portions of the sacrificial release layers 120A using a suitable etch process that removes a predetermined amount of material from the sacrificial release layers 120A, resulting in sacrificial release layers 120B. In one embodiment, this can be accomplished using an isotropic etch, where the etch can be a timed etch to uniformly remove an equal amount of material from each exposed end. The isotropic etch can form indentations having a predetermined indentation depth into the sacrificial release layers 120B.

In one or more embodiments, an indentation fill layer 152 can be formed on the sacrificial layers 120B, where the indentation fill layer 152 can fill the indentations adjacent to the remaining portion of the sacrificial release layers 120B, and may be etched back by the RIE to leave the indentation fill layers 152 in alignment with the indentations made to layers 120B.

In one or more embodiments, the indentation fill layer 152 can be formed by any suitable deposition process, e.g. ALD, CVD, PECVD, or combinations thereof, where in one embodiment, the indentation fill layer 152 can be conformally deposited within the indentations to fill the indentations. As with spacer(s) 150, the indentation fill layer 152 can be any suitable material for filling the indentation, including but not limited to a nitride or oxide material, e.g. silicon nitride (SiN), a silicon oxide (SiO), silicon oxynitride (SiON), silicon borocarbonitride (SIBCN), silicon carbooxide (SiCN), silicon oxicarbonitride (SiOCN) or suitable combinations thereof.

Figure 6:
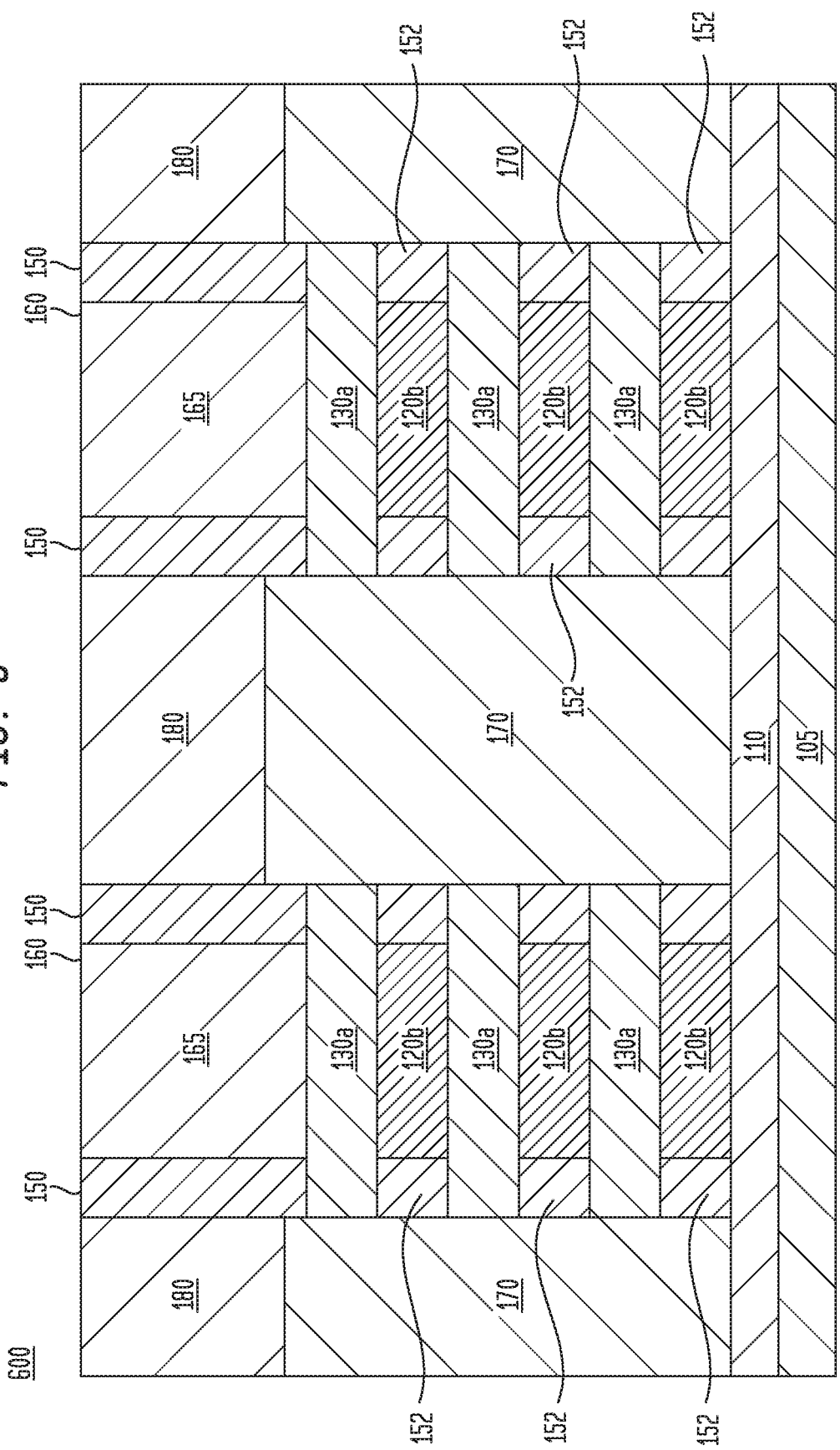
FIG. 6 illustrates formation of a source/drain region in accordance with at least one embodiment of the present disclosure.

FIG. 6 illustrates forming a source/drain region(s) (also referred to as a "S/D region(s)", where the material comprising the S/D region is referred to as "a source/drain semiconductor material") and an interlayer dielectric material (ILD) in the openings provided for in structure 500, resulting in structure 600. In one embodiment, the source/drain region can be formed by an epitaxial growth process relative to suitable exposed surfaces in the opening 155, e.g. material that is lattice matched or substantially lattice matched to the deposited material constituting the source drain region 170, e.g. an epitaxial growth process in relation to exposed crystalline faces of layer 130A. In one embodiment, the source/drain regions 170 can be in physical and electrical contact with each of the one or more nanosheet channel layer(s) 130A, and in physical contact with the epitaxial oxide layer 110.

In one embodiment, the source/drain region(s) 170 can be silicon or silicon-germanium suitably doped to form an n-type (silicon) or a p-type (silicon-germanium) field effect transistor (nFET or pFET). The S/D region(s) can be doped in situ (i.e. during formation), e.g. phosphorous for the nFET and boron for the pFET.]

In one embodiment, the interlayer dielectric (ILD) 180 can be formed on the source/drain region(s) 170. The interlayer dielectric (ILD) 180 can be formed by a blanket deposition that covers the source/drain region(s) 180, as well as portions of the dummy gate(s) 160. The interlayer dielectric (ILD) 170 can extend above the top surface of the dummy gates 160, and chemical-mechanical polishing (CMP) can be utilized to remove the excess material and provide a smooth, flat surface. In one embodiment, the ILD can be silicon oxide, a low-k dielectric, or other suitable material, where the ILD can be formed by a suitable deposition process, e.g. CVD.

Figure 7:
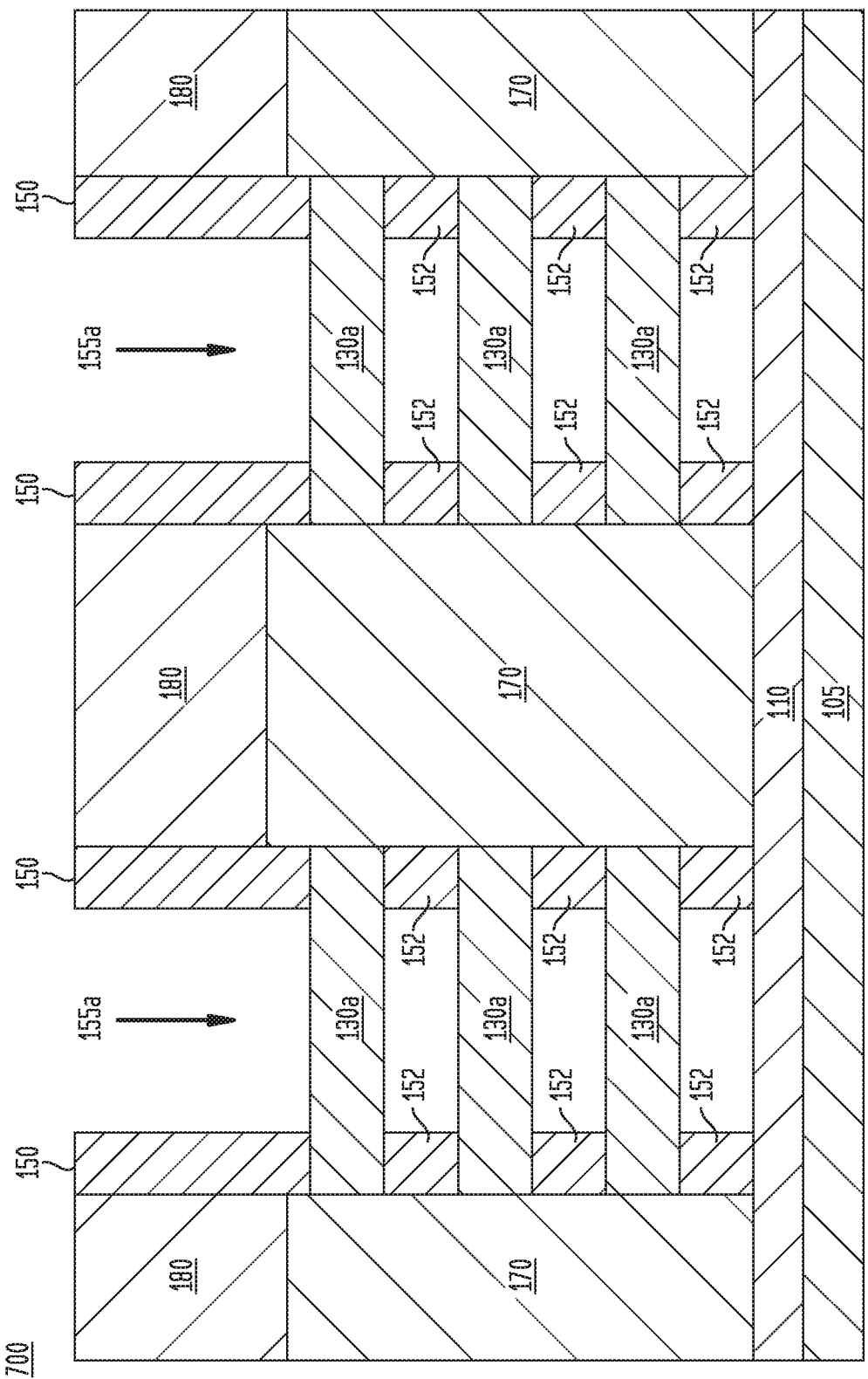
FIG. 7 illustrates a recess process in accordance with at least one embodiment of the present disclosure.

FIG. 7 illustrates a removal process performed on structure 600, resulting in structure 700. In one embodiment, the dummy gate fill 165 of the dummy gate(s) 160 can be removed to expose the underlying stack, where the dummy gate fill can be selectively removed. Selective removal of the dummy gate fill 165 can expose at least a portion of the underlying sacrificial release layer(s) 120B and nanosheet channel layer(s) 130A. Removal of the dummy gate fill 165 may also expose at least a portion of the indentation fill layer(s) 152 directly below the side spacer 150. In one embodiment, the side spacer(s) 150 can remain around at least a portion of the stack to provide one or more defined openings, e.g. 155A, for formation of an active gate structure. In one embodiment, the dummy gate fill 165 can be removed by an isotropic etch, for example, a wet etch, that is selective for the material of the dummy gate fill 165 relative to the side spacer 150, sacrificial release layer(s) 120B, and nanosheet channel layers 130A.

In one embodiment, the sacrificial layer(s) 120B of the stack(s) can be removed to release the nanosheet channel layer(s) 130A, where the nanosheet channel layer(s) 130A can be secured at the opposite end faces to the source/drain regions 170. The indentation fill layer 152 can be between the source/drain regions 170 in the recess(es) 155. The nanosheet channel layer(s) 130A can span the distance between the two source/drain regions 170 on opposite sides in relation thereto. In one embodiment, the sacrificial release layer(s) 120B can be removed using an isotropic etch, for example, a wet etch selective for the material of the sacrificial release layer(s) 120B. In various embodiments, the etchant can be introduced into the opening 155A, such that the etchant can access the sides of the stack including the sidewalls of the sacrificial release layer(s) 120B. In one embodiment, a sacrificial release layer 120B is between the epitaxial oxide layer 110 and the lower-most nanosheet channel layer 130A, so a subsequently formed gate electrode (i.e., work function layer and gate fill layer) can wrap around the lower-most nanosheet channel layer 130A, while also being electrically isolated, e.g. in terms of prohibiting a leakage path as a result of being in contact with layer 110, as opposed to the substrate 105.

Figure 8:
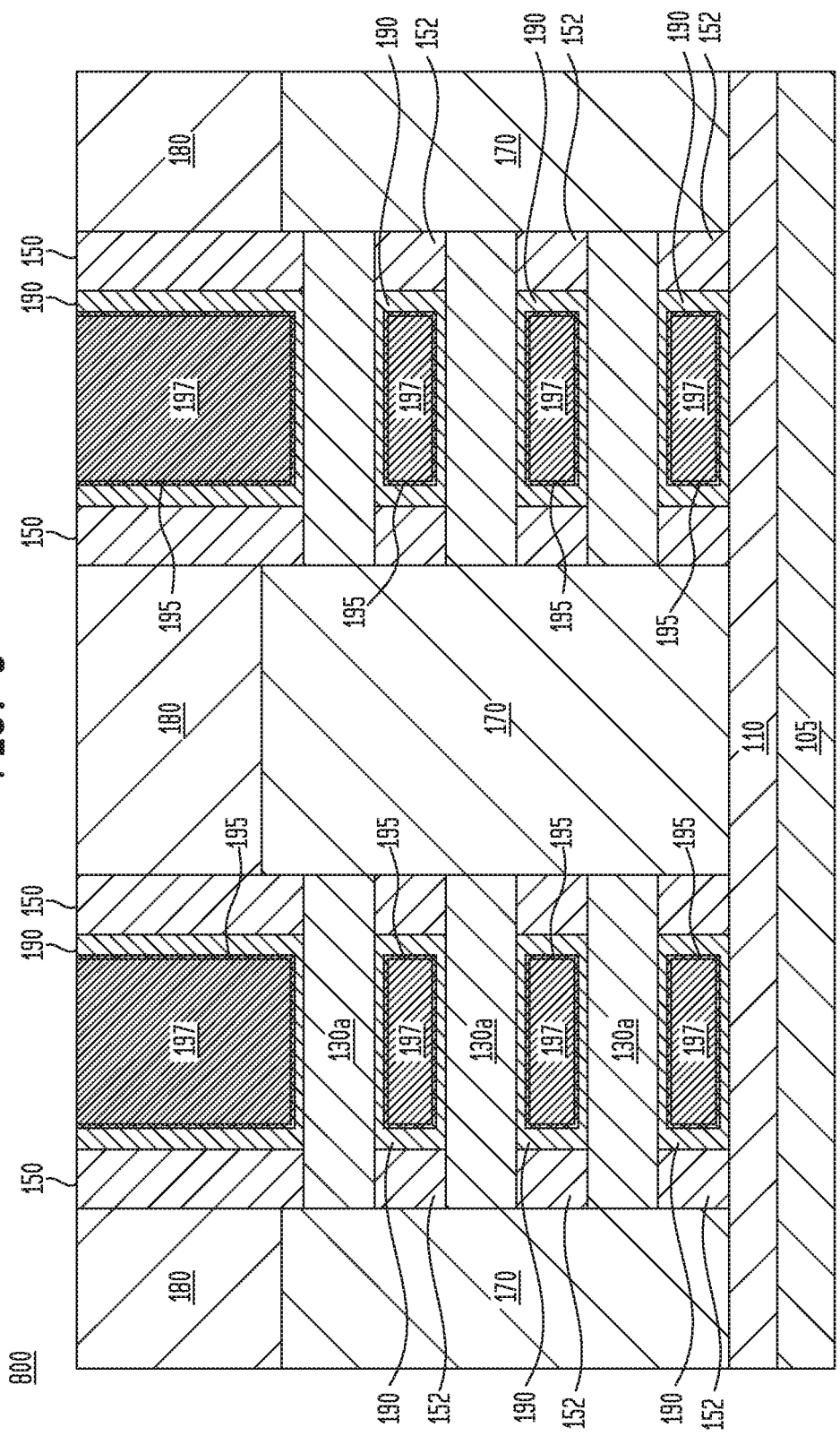
FIG. 8 illustrates a metal and dielectric material deposition/formation process in accordance with at least one embodiment of the present disclosure.

FIG. 8 illustrates adding one or more functional gate materials to structure 700, resulting in structure 800. In one embodiment, on or more gate dielectric layer(s) 190 can be formed on the exposed surfaces of the nanosheet channel layer(s) 130A and/or the exposed surfaces of spacer(s) 150, where the gate dielectric layer 190 can be formed by a conformal deposition process, for example, ALD, CVD, or combinations thereof. In one embodiment, the gate dielectric layer 190 can be an insulating dielectric layer, for example, a silicon oxide (SiO), silicon nitride (SiN), silicon oxynitride (SiON), a high-k dielectric, a suitable combination of these materials, or any other suitable material.

In one embodiment, the gate dielectric layer 190 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

In one embodiment, one or more work function layer(s) 195 can be formed on the gate dielectric layer 190, where the work function layer and gate dielectric layer 190 can surround at least a portion of each of the one or more nanosheet channel layer(s) 130A. A work function layer 195 can be formed on the exposed portion(s) of the gate dielectric layer 190 between the nanosheet channel layer(s) 130A.

In one embodiment, the work function layer 195 can fill in the spaces between the gate dielectric layer 190 on the nanosheet channel layer(s) 130A. The work function layer 195 can be formed by a conformal deposition, for example, by atomic layer deposition (ALD).

In various embodiments, a work function layer 195 can be a conductive nitride, or any other suitable conductive material as disclosed herein or otherwise suitable as an appropriate conductor, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 195 can include multiple layers of work function materials, for example, a work function layer can be a TiN/TiC stack. (For convenience, the work function layer and the dielectric layer 190 may be referred to collectively as "a functional gate layer").

As seen in FIG. 8, and in accordance with at least one technique and principle of the present disclosure, the bottom most gate structure(s), which can include a dielectric layer 190 and a work function layer 195, is in contact with the epitaxial oxide layer 110, which isolates the gate structure and the stack above it from the substrate 105. As repeatedly stated, this prevents parasitic conditions, e.g. leakage current flowing into the substrate, from compromising device functionality.

In one or more embodiments, a gate fill layer 197 can be formed on the gate dielectric 190 in between the spacer(s) 150, where the gate fill layer 197 can fill in the space of opening 155A in between side spacer(s) 150. The gate fill layer 197 and gate dielectric layer 190 can form a gate structure on one or more nanosheet channel layer(s) 130A, where the gate fill layer 197 and work function layer 195 can form a conductive gate electrode.

In various embodiments, the gate fill layer 197 can be blanket deposited on the exposed surfaces of the gate dielectric layer 190 and/or work function layer 195. The formed gate fill layer 197 can extend above the top surface of the interlayer dielectric 180, where the gate fill layer material above the top surfaces of the interlayer dielectric 180 can be removed by CMP to provide a flat, uniform surface.

In various embodiments, the gate fill layer 197 can be a conductive metal, or any other suitable conductive material as disclosed herein or otherwise suitable as an appropriate conductor, where the metal can be tungsten (W), titanium (Ti), molybdenum (Mo), cobalt (Co), or a conductive carbon material (e.g., carbon nanotube, graphene, etc.), or any suitable combinations thereof.

Although the above embodiments are with respect to stacked nanosheets, the teachings contained in the present disclosure can be used to develop other semiconductor structures and methods for making the same; for example, the present techniques can be used to enable source/drain isolation in otherwise standard FinFET devices. For instance, and in accordance with the present disclosure, epitaxial oxide can be used below a FinFET to provide applicable isolation as well.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method for forming a semiconductor structure comprising:
   providing a substrate;
   epitaxially growing an oxide layer over the substrate;
   epitaxially growing a stack of a plurality of alternating semiconductor layers over the epitaxial oxide layer;
   forming a plurality of suspended nanosheets from the epitaxially grown alternating semiconductor layers;
   forming a source/drain semiconductor region in contact with lateral portions of the plurality of suspended nanosheets and the epitaxial oxide layer, wherein forming the plurality of suspended nanosheets comprises:
      forming, by epitaxial growth, at least two stacks, each including a plurality of sacrificial release layers and at least one alternating nanosheet channel layer on the substrate;
      forming a dummy gate on a top most layer of each of the at least two stacks; and after forming the source/drain semiconductor region, removing both of i) the dummy gate on a top most layer of each of the at least two stacks and ii) the plurality of sacrificial release layers to create the plurality of suspended nanosheets, wherein the source/drain semiconductor region physically supports and is in contact with the plurality of suspended nanosheets;

forming a plurality of functional gate structures, each of the plurality of functional gate structures in contact with at least one of the plurality of suspended nanosheets; and decoupling the i) the plurality of functional gate structures and ii) the plurality of suspended nanosheets from the substrate by contacting at least a portion of a bottom one of the plurality of functional gate structures with the epitaxial oxide layer.

2. The method according to claim 1, wherein the epitaxial oxide layer is between 10 nm and 20 nm in thickness.

3. The method according to claim 1, wherein the epitaxial oxide layer is selected from the group consisting of: ($CeO_2$), aluminum oxide ($Al_2O_3$), lanthanum oxide ($La_2O_3$), yttrium oxide ($Y_2O_3$), ytterbium oxide ($Yb_2O_3$), gadolinium oxide ($Gd_2O_3$), europium oxide ($Eu_2O_3$), erbium trioxide ($Er_2O_3$), dysprosium oxide ($Dy_2O$), holmium oxide ($Ho_2O_3$), thulium oxide ($Tm_2O_3$), lutetium oxide ($Lu_2O_3$), terbium oxide, ($Tb_2O_3$), hafnium oxide ($HfO_2$) or combinations thereof.

4. The method of claim 1, wherein material constituting the source/drain region contacts the epitaxial oxide layer.

5. The method of claim 4, wherein a plurality of spacers remain on the structure after removal of the dummy gate.

* * * * *